(12) United States Patent
Chun

(10) Patent No.: US 10,396,195 B2
(45) Date of Patent: Aug. 27, 2019

(54) SEMICONDUCTOR DEVICE AND METHOD MANUFACTURING THE SAME

(71) Applicants: Hyundai Motor Company, Seoul (KR); Kia Motors Corporation, Seoul (KR)

(72) Inventor: Dae Hwan Chun, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 15/980,064

(22) Filed: May 15, 2018

(65) Prior Publication Data
US 2019/0189799 A1    Jun. 20, 2019

(30) Foreign Application Priority Data

Dec. 14, 2017  (KR) .................. 10-2017-0172298

(51) Int. Cl.
| H01L 29/76 | (2006.01) |
| H01L 29/94 | (2006.01) |
| H01L 29/78 | (2006.01) |
| H01L 29/08 | (2006.01) |
| H01L 21/265 | (2006.01) |
| H01L 29/66 | (2006.01) |

(52) U.S. Cl.
CPC .... *H01L 29/7813* (2013.01); *H01L 21/26513* (2013.01); *H01L 29/0865* (2013.01); *H01L 29/66734* (2013.01)

(58) Field of Classification Search
CPC ............. H01L 29/7813; H01L 29/4236; H01L 29/66734; H01L 21/26513; H01L 29/0847; H01L 29/0865

USPC ........................................................ 257/330
See application file for complete search history.

(56) References Cited

U.S. PATENT DOCUMENTS

| 7,671,441 B2 | 3/2010 | Henson | |
| 7,998,808 B2* | 8/2011 | Viswanathan | ........ H01L 29/407 438/243 |
| 2008/0153254 A1* | 6/2008 | Yoneda | ............. H01L 21/76232 438/425 |

FOREIGN PATENT DOCUMENTS

KR        10-0771815 B1    10/2007

* cited by examiner

*Primary Examiner* — Theresa T Doan
(74) *Attorney, Agent, or Firm* — Mintz Levin Cohn Ferris Glovsky and Popeo, P.C.; Peter F. Corless

(57) ABSTRACT

A semiconductor device is provided and includes an n− type layer disposed at a substrate first surface. A trench, n type region, and p+ type region are disposed on the n− type layer. A p type region is disposed on the n type region. An n+ type region is disposed on the p type region. A gate insulating layer is disposed in the trench. A gate electrode is disposed on the gate insulating layer. A source electrode is disposed on an insulating layer disposed on the gate electrode, n+ type region, and p+ type region. A drain electrode is disposed at a substrate second surface. The n type region includes a first portion contacting the trench side surface and extending parallel to a substrate upper surface and a second portion contacting the first portion, separated from the trench side surface, and extending vertical to the substrate upper surface.

8 Claims, 9 Drawing Sheets

SEMICONDUCTOR DEVICE AND METHOD MANUFACTURING THE SAME

CROSS-REFERENCE TO RELATED APPLICATION

This application claims priority to and the benefit of Korean Patent Application No. 10-2017-0172298 filed on Dec. 14, 2017, the entire contents of which are incorporated herein by reference.

BACKGROUND

(a) Technical Field

The present invention relates to a semiconductor device and a manufacturing method thereof, and more particularly to a semiconductor device and a manufacturing method thereof that improve a performance index of the semiconductor device.

(b) Description of the Related Art

A power semiconductor device requires a low on resistance or a low saturation voltage to reduce the power loss in the conduction state while flowing a substantial current. In addition, a characteristic that may withstand a reverse direction high voltage applied to both terminals of the power semiconductor device during an off state or when the switch is turned off, that is, a high breakdown voltage characteristic is required.

A concentration and a thickness of an epitaxial layer or a drift region of a row material to form the power semiconductor device are determined based on a rated voltage required by a power system. According to a Poisson equation, since the high breakdown voltage of the power semiconductor device is required, the epitaxial layer or the drift region of the low concentration and the thick thickness are required thus causing on resistance to increase and a foreword direction current density to decrease.

The above information disclosed in this section is merely for enhancement of understanding of the background of the invention and therefore it may contain information that does not form the prior art that is already known in this country to a person of ordinary skill in the art.

SUMMARY

The present invention improves a characteristic of the semiconductor device. A semiconductor device according to an exemplary embodiment of the present invention may include an n− type layer disposed at a first surface of a substrate; a trench, an n type region, and a p+ type region disposed on the n− type layer; a p type region disposed on the n type region; an n+ type region disposed on the p type region; a gate insulating layer disposed in the trench; a gate electrode disposed on the gate insulating layer; an insulating layer disposed on the gate electrode; a source electrode disposed on the insulating layer, the n+ type region, and the p+ type region; and a drain electrode disposed at a second surface of the substrate, wherein the n type region includes a first portion in contact with the side surface of the trench and extending parallel to an upper surface of the substrate and a second portion in contact with the first portion, separated from the side surface of the trench, and extending in a direction vertical to the upper surface of the substrate.

The depth of the first portion may be less than the depth of the trench, and the depth of the second portion may be greater than the depth of the trench. The depth of the p+ type region may be greater than the depth of the trench. The depth of the p+ type region may be greater than the depth of the second portion. The n type region, the p type region, and the n+ type region may be disposed between the p+ type region and the side surface of the trench.

The second portion may be in contact with the side surface of the first portion, and the ion doping concentration of the second portion may be greater than the ion doping concentration of the first portion. The second portion may be in contact with the lower surface of the first portion, and the ion doping concentration of the second portion may be less than the ion doping concentration of the first portion. The first portion may be in contact with the p+ type region.

A manufacturing method of a semiconductor device according to an exemplary embodiment of the present invention may include sequentially forming an n− type layer, a preliminary n type region, a p type region, and an n+ type region at a first surface of the substrate; etching the n+ type region, the p type region, the preliminary n type region, and the n− type layer to form a trench; forming a preliminary gate insulating layer in the trench; forming a gate electrode on the preliminary gate insulating layer; forming a preliminary insulating layer on the gate electrode; forming a p+ type region on the n− type layer; etching the preliminary gate insulating layer and the preliminary insulating layer to form a gate insulating layer and an insulating layer; forming a second portion of the n type region on the n− type layer; forming a source electrode on the insulating layer, the n+ type region, and the p+ type region; and forming a drain electrode a second surface of the substrate. Further, the preliminary n type region becomes a first portion of the n type region in the formation of the p+ type region, the first portion of the n type region is in contact with the side surface of the trench and extends parallel to the upper surface of the substrate, and the second portion of the n type region is in contact with the first portion, is separated from the side surface of the trench, and extends in the direction vertical to the upper surface of the substrate.

The formation of the p+ type region may include injecting a p type ion to the upper surface of the n− type layer using the preliminary insulating layer as a mask. Additionally, the formation of the second portion of the n type region may include injecting an n type ion to the upper surface of the n+ type region and the p+ type region using the insulating layer as a mask.

As above-described, according to an exemplary embodiment of the present invention, the performance index of the semiconductor device including all of the breakdown voltage and the on resistance characteristic may be improved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
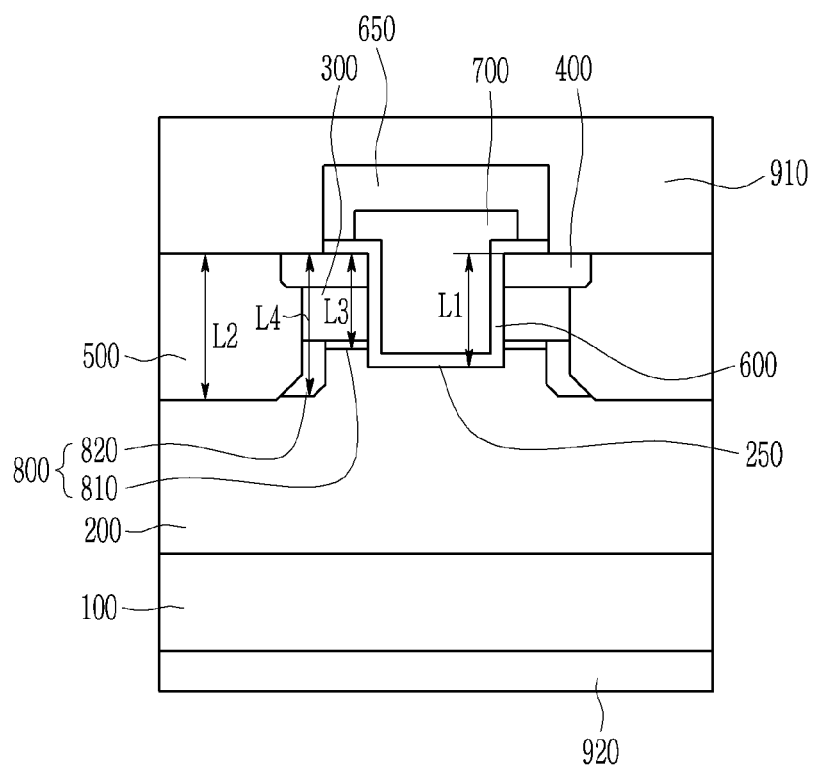
FIG. 1 is a cross sectional view of a semiconductor device according to an exemplary embodiment of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present invention will be described in detail with reference to the accompanying drawings. As those skilled in the art would realize, the described exemplary embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it may be directly on the other layer or substrate, or intervening them may also be present.

FIG. 1 is a cross sectional view of a semiconductor device according to an exemplary embodiment of the present invention. Referring to FIG. 1, the semiconductor device according to the present exemplary embodiment may include a substrate 100, an n− type layer 200, a p type region 300, an n+ type region 400, a p+ type region 500, a gate electrode 700, an n type region 800, a source electrode 910, and a drain electrode 920.

The substrate 100 may be an n+ type silicon carbide substrate. The n− type layer 200 may be disposed on a first surface of the substrate 100. A trench 250, the p+ type region 500, and the n type region 800 may be disposed on the n− type layer 200. The p type region 300 may be disposed on the n type region 800. The n+ type region 400 may be disposed on the p type region 300. The p+ type region 500 may be separated from the side surface of the trench 250, and the n type region 800, the p type region 300, and the n+ type region 400 may be disposed adjacent to the side surface of the trench 250. In other words, the n type region 800, the p type region 300, and the n+ type region 400 may be disposed between the p+ type region 500 and the side surface of the trench 250.

An ion doping concentration of the p+ type region 500 may be greater than the ion doping concentration of the p type region 300. The ion doping concentration of the n type region 800 may be greater than the ion doping concentration of the n− type layer 200 and less than the ion doping concentration of the n+ type region 400. A depth L2 of the p+ type region 500 may be greater than the depth L1 of the trench 250. Accordingly, in an off state of the semiconductor device, an electric field may be prevented from being focused at the lower portion of the trench 250. In particular, the depth L1 of the trench 250 refers to a vertical distance between the upper surface of the trench 250 and the lower surface of the trench 250. The depth L2 of the p+ type region 500 refers to the vertical distance between an extending line of the upper surface of the trench 250 and the lower surface of the p+ type region 500.

The n type region 800 may include a first portion 810 and a second portion 820. A first side of the first portion 810 may be disposed in contact with the side surface of the trench 250 and may extend to be parallel to the upper surface of the substrate 100. The second portion 820 may be in contact with a second side of the first portion 810 and may extend in the vertical direction to the upper surface of the substrate 100. The second portion 820 may be separated from the side surface of the trench 250 and may be disposed adjacent to the p+ type region 500.

Further, the depth L3 of the first portion 810 may be less than the depth L1 of the trench 250 and the depth L4 of the second portion 820 may be greater than the depth L1 of the trench 250. Additionally, the depth L4 of the second portion 820 may be less than the depth L2 of the p+ type region 500. Accordingly, a path of the current may be dispersed in an on state of the semiconductor device and a formation of a depletion layer between the p+ type region 500 and the trench 250 may be suppressed, while maintaining a breakdown voltage in the on state of the semiconductor device, the current may be increased. In particular, the depth L3 of the first portion 810 refers the vertical distance between the extending line of the upper surface of the trench 250 and the lower surface of the first portion 810. The depth L4 of the second portion 820 refers the vertical distance between the extending line of the upper surface of the trench 250 and the lower surface of the second portion 820. The ion doping concentration of the first portion 810 may be less than the ion doping concentration of the second portion 820.

The gate insulating layer 600 may be disposed in the trench 250, and the gate electrode 700 may be disposed on the gate insulating layer 600. The insulating layer 650 may be disposed on the gate electrode 700. Further, the insulating layer 650 covers the gate electrode 700. The gate insulating layer 600 and the insulating layer 650 may include silicon oxide ($SiO_2$), and the gate electrode 700 may include a poly-crystalline silicone or a metal.

The source electrode 910 may be disposed on the insulating layer 650, the n+ type region 400, and the p+ type region 500, and the drain electrode 920 may be disposed at the second surface of the substrate 100. In particular, the second surface of the substrate 100 indicates an opposite surface to the first surface of the substrate 100. The source electrode 910 and the drain electrode 920 may include an ohmic metal.

Moreover, characteristics of the semiconductor device according to the present exemplary embodiment and the semiconductor device according to comparative examples 1 and 2 will be described with reference to Table 1. The semiconductor device according to the comparative example 1 is a general trench gate MOSFET device. The semiconductor device according to the comparative example 2 is a structure to which the p+ type region having the depth greater than the depth of the trench is applied in the general trench gate MOSFET structure.

Table 1 shows a simulation result of the semiconductor device according to the present exemplary embodiment and the semiconductor device according to comparative examples 1 and 2. In Table 1, a current density is compared with the same breakdown voltage of the semiconductor device according to the present exemplary embodiment and the semiconductor device according to the comparative example.

TABLE 1

| | Breakdown voltage (V) | Current density (A/cm2) | On resistance (mΩ · cm2) | Performance index (MW/cm2) |
|---|---|---|---|---|
| Comparative Example 1 | 388 | 920 | 2.73 | 168 |
| Comparative Example 2 | 1673 | 652 | 3.97 | 705 |
| exemplary embodiment | 1623 | 791 | 3.23 | 815 |

Referring to Table 1, the breakdown voltage is shown to increase by 318% in the semiconductor device according to the present exemplary embodiment compared with the semiconductor device according to the comparative example 1.

Additionally, Table 1 shows that the current density is increased by 21% and the on resistance may be decreased by 19% in the semiconductor device according to the present exemplary embodiment compared with the semiconductor device according to the comparative example 2. Accordingly, in the semiconductor device according to the present exemplary embodiment compared with the semiconductor device according to the comparative example 2, a conductor area to form the same current may be reduced, accordingly, a yield and a cost of the device may be reduced.

Further, compared with the performance index of the semiconductor device including all characteristics of the breakdown voltage and the on resistance, in the semiconductor device according to the present exemplary embodiment, the performance index is increased by 385% compared with the semiconductor device according to the comparative example 1 and performance index is increased by 16% compared with the semiconductor device according to the comparative example 2.

A manufacturing method of the semiconductor device according to an exemplary embodiment of the present invention will be described with reference to FIG. 2 to FIG. 8, and FIG. 1. FIG. 2 to FIG. 8 are cross sectional views of a manufacturing method of a semiconductor device according to an exemplary embodiment of the present invention.

Figure 2:
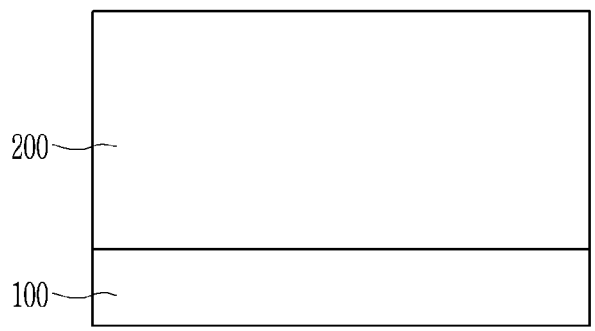
FIG. 2 to FIG. 8 are cross sectional views of a manufacturing method of a semiconductor device according to an exemplary embodiment of the present invention.

Referring to FIG. 2, the substrate 100 may be prepared, and then the n− type layer 200 may be formed at the first surface of the substrate 100. The n− type layer 200 may be formed on the first surface of the substrate 100 by an epitaxial growth. In particular, the substrate 100 may be the n+ type silicon carbide substrate.

Figure 3:
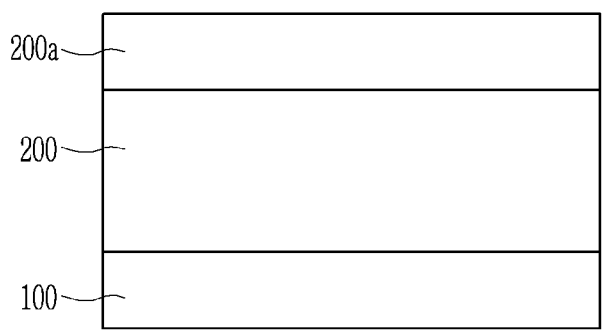

Referring to FIG. 3, a preliminary n type region 200a may be formed on the n− type layer 200. The preliminary n type region 200a may be formed by injecting an n type ion such as nitrogen (N), phosphorus (P), arsenic (As), and antimony (Sb) on the upper surface of the n− type layer 200. However, the present invention is not limited thereto and the preliminary n type region 200a may be formed by the epitaxial growth on the n− type layer 200. An ion doping concentration of the preliminary n type region 200a may be greater than the ion doping concentration of the n− type layer 200.

Figure 4:
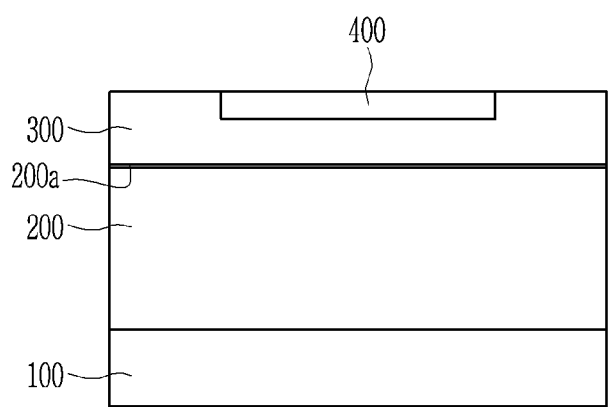

Referring to FIG. 4, the p type region 300 and the n+ type region 400 are sequentially formed on the preliminary n type region 200a. The p type region 300 may be formed by injecting the p type ion such as boron (B), aluminum (Al), gallium (Ga), and indium (In) on the upper surface of the upper surface of the preliminary n type region 200a. The n+ type region 400 may be formed by injecting the n type ion such as nitrogen (N), phosphorus (P), arsenic (As), and antimony (Sb) on the part of the upper surface of the p type region 300. As the p type region 300 is formed, the thickness of the preliminary n type region 200a decreases. In particular, the ion doping concentration of the n+ type region 400 may be greater than the ion doping concentration of the preliminary n type region 200a.

Figure 5:
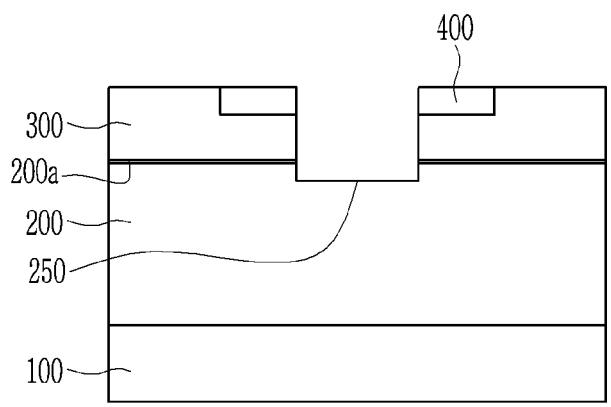

Referring to FIG. 5, the n+ type region 400, the p type region 300, the preliminary n type region 200a, and the n− type layer 200 may be etched to form the trench 250. The trench 250 may penetrate the n+ type region 400, the p type region 300, and the preliminary n type region 200a.

Figure 6:
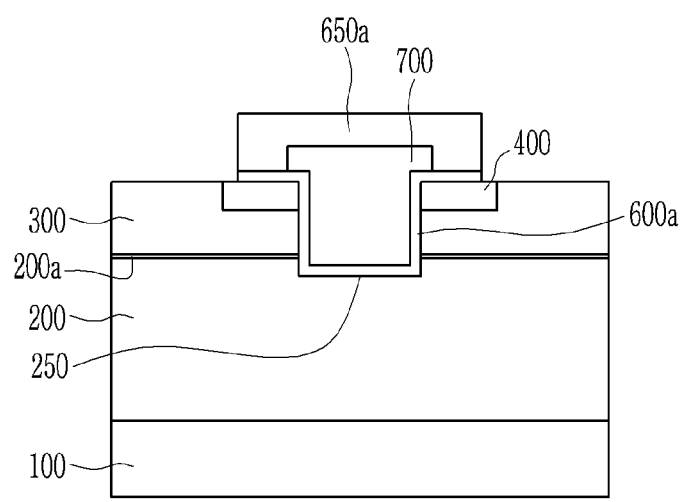

Referring to FIG. 6, a preliminary gate insulating layer 600a may be formed in the trench 250 and on the n+ type region 400, the gate electrode 700 may be formed on the preliminary gate insulating layer 600a, and a preliminary insulating layer 650a may be formed on the gate electrode 700. The preliminary insulating layer 650a may be formed to cover the gate electrode 700.

Figure 7:
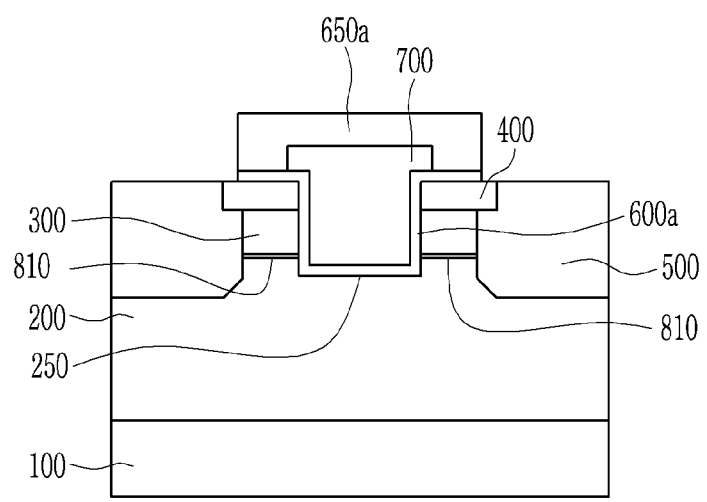

Referring to FIG. 7, the p+ type region 500 may be formed on the n− type layer 200. The p+ type region 500 may be formed by injecting the p type ion such as boron (B), aluminum (Al), gallium (Ga), and indium (In) on the upper surface of the upper surface of the n− type layer 200 using the preliminary insulating layer 650a as a mask. Therefore, the p+ type region 500 may be separated from the side surface of the trench 250, and the preliminary n type region 200a disposed between the p+ type region 500 and the side surface of the trench 250 becomes the first portion 810 of the n type region 800. In particular, the ion doping concentration of the p+ type region 500 may be greater than the ion doping concentration of the p type region 300. The depth of the p+ type region 500 may be formed to be greater than the depth of the trench 250 and the depth of the first portion 810 of the n type region 800.

As above-described, as the p+ type region 500 may be formed using the preliminary insulating layer 650a as the mask, the p+ type region 500 may be formed without an additional mask.

Figure 8:
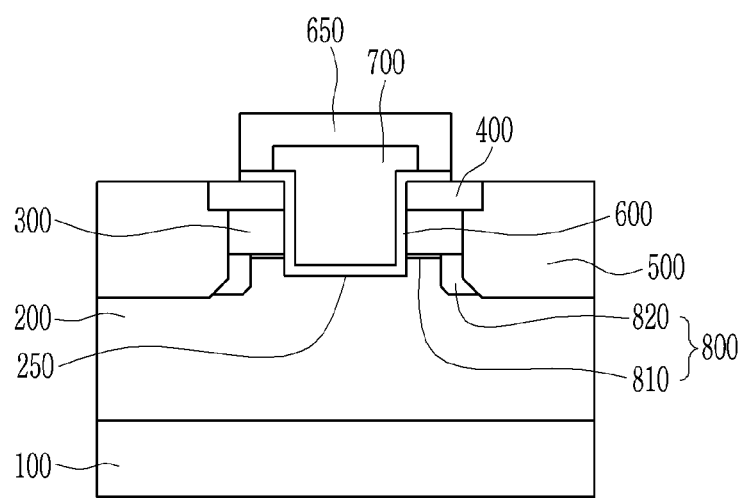

Referring to FIG. 8, the preliminary gate insulating layer 600a and the preliminary insulating layer 650a may be partially etched to form the gate insulating layer 600 and the insulating layer 650, and the second portion 820 of the n type region 800 may be formed. The second portion 820 of the n type region 800 may be formed by injecting the p type ion such as boron (B), aluminum (Al), gallium (Ga), and indium (In) on the upper surface of the n+ type region 400 and the p+ type region 500 using the insulating layer 650 as the mask. The doped n type ion may be diffused to be in contact with the first portion 810 of the n type region 800 and may form the second portion 820 of the n type region 800 that extends in the vertical direction to the upper surface of the substrate 100. Accordingly, the second portion 820 of the n type region 800 may be separated from the side surface of the trench 250 and may be adjacent to the p+ type region 500. In particular, the ion doping concentration of the second portion 820 of the n type region 800 may be greater than the ion doping concentration of the first portion 810 of the n type region 800. The depth of the second portion 820 of the n type region 800 may be formed to be greater than the depth of the trench 250 and to be less than the depth of the p+ type region 500.

As above-described, the second portion 820 of the n type region 800 may be formed using the insulating layer 650 as the mask and the additional mask may be omitted. Since the second portion 820 of the n type region 800 and the p+ type region 500 may be formed without the additional mask, an alignment error between the second portion 820 of the n type region 800 and the p+ type region 500 may be reduced. Referring to FIG. 1, the source electrode 910 may be formed on the insulating layer 650, the n+ type region 400, and the p+ type region 500, and the drain electrode 920 may be formed on the second surface of the substrate 100. In particular, the second surface of the substrate 100 indicates the opposite surface to the first surface of the substrate 100.

Figure 9:
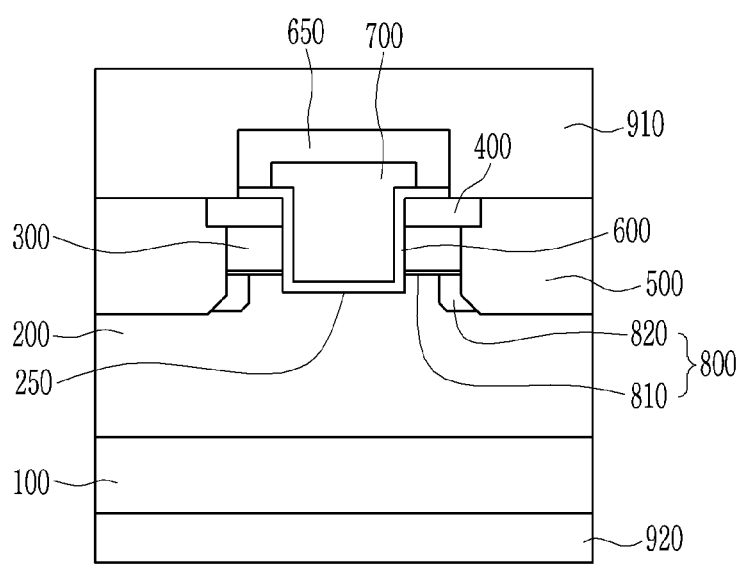
FIG. 9 is a cross sectional view of a semiconductor device according to another exemplary embodiment of the present invention.

Further, the semiconductor device according to another exemplary embodiment of the present invention will be described with reference to FIG. 9. FIG. 9 is a cross sectional view\of a semiconductor device according to another exemplary embodiment of the present invention. Referring to FIG. 9, the semiconductor device according to the present exemplary embodiment has the same structure as the semiconductor device of FIG. 1 except for the structure of the n type region 800. The description of the same structure is omitted.

The n type region 800 may be disposed on the n− type layer 200 and may include the first portion 810 and the second portion 820. A first side of the first portion 810 may be disposed adjacent to the side surface of the trench 250 and extend parallel to the upper surface of the substrate 100. A second side of the first portion 810 may be disposed adjacent to the p+ type region 500. The second portion 820 may be in contact with the lower surface of the first portion 810 and extend in the vertical direction to the upper surface of the substrate 100. The second portion 820 may be disposed to be separated from the side surface of the trench 250 and to be adjacent to the p+ type region 500. The ion doping concentration of the first portion 810 may be greater than the ion doping concentration of the second portion 820. The depth of the first portion 810 and the depth of the second portion 820 are the same as the semiconductor device according to FIG. 1.

While this invention has been described in connection with what is presently considered to be exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

100: substrate
200: n− type layer
250: trench
300: p type region
400: n+ type region
500: p+ type region
600: gate insulating layer
600a: preliminary gate insulating layer
650: insulating layer
650a: preliminary insulating layer
700: gate electrode
800: n type region
810: first portion
820: second portion
910: source electrode
920: drain electrode

What is claimed is:

1. A semiconductor device, comprising:
   an n− type layer disposed at a first surface of a substrate;
   a trench, an n type region, and a p+ type region disposed on the n− type layer;
   a p type region disposed on the n type region;
   an n+ type region disposed on the p type region;
   a gate insulating layer disposed in the trench;
   a gate electrode disposed on the gate insulating layer;
   an insulating layer disposed on the gate electrode;
   a source electrode disposed on the insulating layer, the n+ type region, and the p+ type region; and
   a drain electrode disposed at a second surface of the substrate,
   wherein the n type region includes a first portion in contact with the side surface of the trench and extending parallel to an upper surface of the substrate and a second portion in contact with the first portion, separated from the side surface of the trench, and extending in a direction vertical to the upper surface of the substrate.

2. The semiconductor device of claim 1, wherein the depth of the first portion is less than the depth of the trench, and the depth of the second portion is greater than the depth of the trench.

3. The semiconductor device of claim 2, wherein the depth of the p+ type region is greater than the depth of the trench.

4. The semiconductor device of claim 3, wherein the depth of the p+ type region is greater than the depth of the second portion.

5. The semiconductor device of claim 4, wherein the n type region, the p type region, and the n+ type region are disposed between the p+ type region and the side surface of the trench.

6. The semiconductor device of claim 5, wherein the second portion is in contact with the side surface of the first portion, and the ion doping concentration of the second portion is greater than the ion doping concentration of the first portion.

7. The semiconductor device of claim 5, wherein the second portion is in contact with the lower surface of the first portion, and the ion doping concentration of the second portion is less than the ion doping concentration of the first portion.

8. The semiconductor device of claim 7, wherein the first portion is in contact with the p+ type region.

* * * * *